(12) United States Patent
Ueno

(10) Patent No.: US 6,765,294 B1
(45) Date of Patent: Jul. 20, 2004

(54) SEMICONDUCTOR DEVICE INCLUDING DUAL-DAMASCENE STRUCTURE AND METHOD FOR MANUFACTURING THE SAME

(75) Inventor: Kazuyoshi Ueno, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/488,619

(22) Filed: Jan. 20, 2000

(30) Foreign Application Priority Data

Jan. 22, 1999 (JP) .......................... 11-015029

(51) Int. Cl.⁷ .............................................. H01L 23/48
(52) U.S. Cl. ...................... 257/748; 257/750; 257/759; 257/758
(58) Field of Search .................... 257/748, 700, 257/692, 686, 717, 758, 759, 760, 773, 706, 750; 438/18, 682

(56) References Cited

U.S. PATENT DOCUMENTS

| | | | |
|---|---|---|---|
| 5,578,523 A | | 11/1996 | Fiordalice et al. |
| 5,741,626 A | | 4/1998 | Jain et al. |
| 6,054,769 A | * | 4/2000 | Jeng ............................ 257/758 |
| 6,147,399 A | * | 11/2000 | Li et al. ...................... 257/700 |
| 6,277,728 B1 | * | 8/2001 | Ahn et al. ................... 438/619 |

FOREIGN PATENT DOCUMENTS

| | | | | |
|---|---|---|---|---|
| JP | 4- 30524 | 2/1992 | ......... | H01L/21/312 |
| JP | 5-267282 | 10/1993 | ......... | H01L/21/316 |
| JP | 5-267283 | 10/1993 | ......... | H01L/21/316 |
| JP | 09-153545 | 6/1997 | ......... | H01L/21/768 |
| JP | 09-306988 | 11/1997 | ......... | H01L/21/768 |
| JP | 10-214892 | 8/1998 | ......... | H01L/21/768 |

* cited by examiner

Primary Examiner—Long Pham
Assistant Examiner—(Vikki) Hoa B. Trinh
(74) Attorney, Agent, or Firm—Hayes Soloway P.C.

(57) ABSTRACT

A semiconductor device includes a lower wiring layer, a first insulating layer formed on the lower wiring layer and having a via hole with a width, a via mask layer formed on the first insulating layer and having an opening with a width larger than the width of the via hole, a second insulating layer formed on the via mask layer and having an upper wiring, groove whose width coincides with the width of the via hole, a via contact structure buried in the via hole, and an upper wiring layer buried in the upper wiring groove.

32 Claims, 8 Drawing Sheets

SEMICONDUCTOR DEVICE INCLUDING DUAL-DAMASCENE STRUCTURE AND METHOD FOR MANUFACTURING THE SAME

BACKGROUND OF THE INVENTION

1. Field of the Invention

The present invention relates to a semiconductor device including multi-layered wiring layers connected by a via contact structure and a method for manufacturing such a semiconductor device.

2. Description of the Related Art

As semiconductor devices have been become more finely structured, multi-layered wiring layers have also become fine. Simultaneously, a via contact structure for connecting one wiring layer to another has also become finer.

On the other hand, in order to improve the manufacturing yield, a dual-damascene structure has been developed. According to this dual-damascene structure, a via contact structure and an upper wiring layer are simultaneously formed.

In a prior art method for manufacturing a semiconductor device including a dual-damascene structure, a first insulating layer is formed on a lower wiring layer, and an upper wiring mask layer having an opening is formed on the first insulating layer. Then, a second insulating layer is formed on the upper wiring layer, and an upper wiring pattern layer is formed on the second insulating layer. In this case, the upper wiring pattern layer has an opening with a width larger than a width of the opening of the upper wiring mask layer. Then, the first and second insulating layers are etched by using the upper wiring pattern layer as a mask to create a via hole and an upper wiring groove in the first and second insulating layers, respectively. Then, a conductive layer is buried in the via hole and the upper wiring groove, so that a first part of the conductive layer buried in the via hole serves as a via contact structure and a second part of the conductive layer buried in the upper wiring groove serves as a lower wiring layer. This will be explained later in detail.

In the above-described prior art method, however, since the width of the via contact structure is smaller than the width of the upper wiring layer, the contact area between the via contact structure and the upper wiring layer is so small as to increase the resistance therebetween. As a result, the current density of a current flowing through the via contact structure is increased to generate electromigration therein, which would disconnect the via contact structure. Thus, the reliability is deteriorated.

Also, in the above-described prior art method, if the second insulating layer is made of silicon oxide, it is difficult to form the upper wiring pattern layer due to the recess portion of the second insulating layer. In order to avoid this difficulty, an additional flattening process such as a chemical mechanical polishing (CMP) process can be performed upon the surface of the second insulating layer which, however, would increase the manufacturing cost.

SUMMARY OF THE INVENTION

It is an object of the present invention to provide a semiconductor device including a dual-damascene structure capable of decreasing the resistance between a via contact structure and its upper wiring layer.

Another object of the present invention is to provide a method for manufacturing such a semiconductor device.

According to the present invention, a first insulating layer is formed on a lower wiring layer having a via hole. Then, an upper wiring mask layer having an opening opposing the via hole is formed on the first insulating layer. The width of the opening is larger than that of the via hole. Then, a second insulating layer having an upper wiring groove whose width coincides with the via hole is formed on the upper wiring mask layer. Then, a via contact structure and an upper wiring layer are simultaneously buried in the via hole and the upper wiring groove, respectively. Since the width of the via contact structure is the same as that of the upper wiring layer, the contact area therebetween is increased.

Also, the second insulating layer is made of fluid coating material, so that it is easy to form the upper wiring pattern layer due to there being no recess portion of the second insulating layer.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art method for manufacturing a semiconductor device including a dual-damascene structure will be explained with reference to FIGS. 1A through 1F and 2.

Figure 1A:
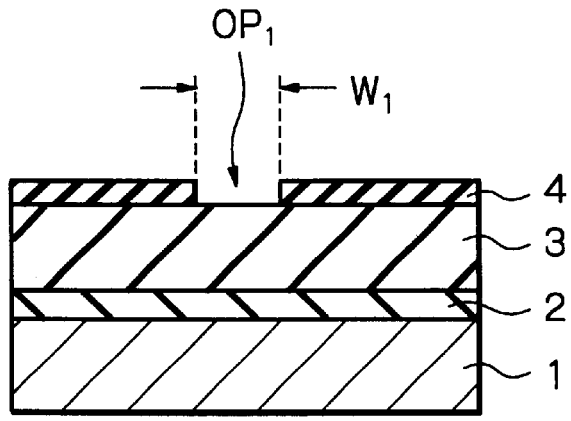
FIGS. 1A through 1F are cross-sectional views for explaining a prior art method for manufacturing a semiconductor device.

First, referring to FIG. 1A, reference numeral 1 designates a lower wiring layer which is formed by an impurity diffusion region in a semiconductor substrate (not shown) or is formed by a conductive layer on an insulating layer (not shown) formed on the semiconductor substrate. Then, an insulating layer 2 made of silicon nitride (SiN) is deposited on the lower wiring layer 1 by a plasma chemical vapor deposition (CVD) process. Then, an insulating layer 3 made of silicon oxide ($SiO_2$) is deposited on the insulating layer 2 by a plasma CVD process. Then, the surface of the insulating layer 3 is flattened by a chemical mechanical polishing (CMP) process. Then, an insulating layer 4 made of SiON as an upper wiring mask is deposited on the insulating layer 3 by a plasma CVD process. Then, an opening $OP_1$ having a width $W_1$ is perforated in the insulating layer 4 by a photolithography and dry etching process by $CF_4$ gas using the insulating layer 3 as an etching stopper. Note that the opening $OP_1$ defines the size of a via contact structure.

Figure 1B:
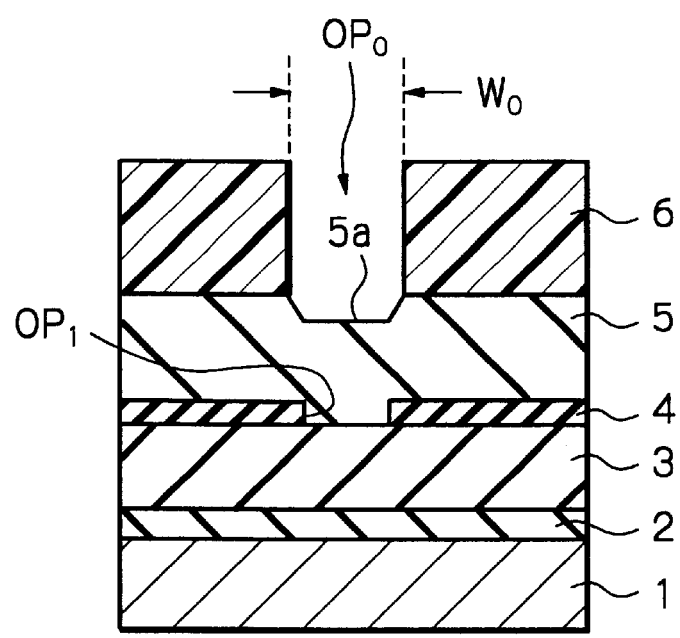

Next, referring to FIG. 1B, an insulating layer 5 made of $SiO_2$ is deposited on the entire surface by a plasma CVD process. In this case, a recess portion 5a is created in the insulating layer 5 due to the presence of the opening $OP_1$ of the insulating layer 4. Then, a photoresist pattern 6 where an opening $OP_0$ having a width $W_0$ ($>W_1$) is formed on the insulating layer 5. Note that the opening $OP_0$ defines the size of an upper wiring layer.

Figure 1C:
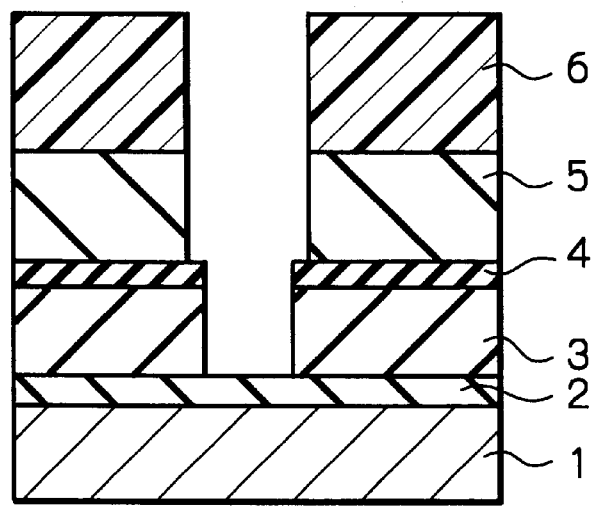

Next, referring to FIG. 1C, the insulating layers 5 and 3 are etched by a dry etching process by $CHF_3$ gas or a mixture gas of $CF_4$ and $H_2$ using the photoresist pattern 6 as a mask and the insulating layers 4 and 2 as etching stoppers.

Figure 1D:
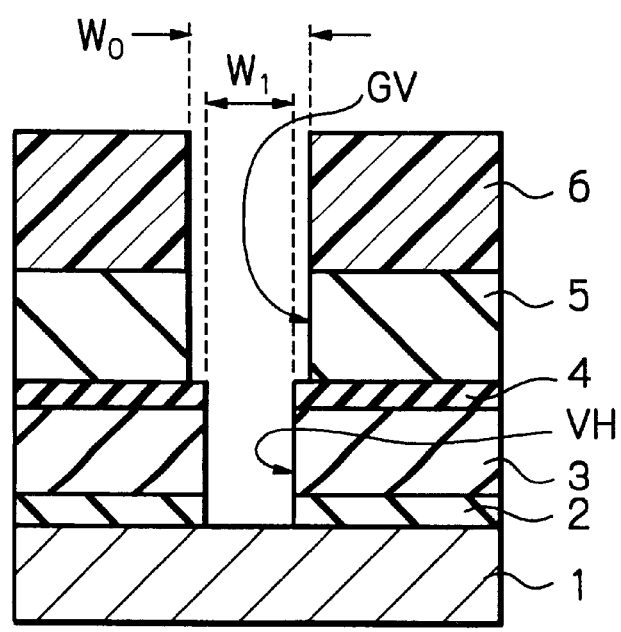

Next, referring to FIG. 1D, an exposed portion of the insulating layer 2 is etched by a dry etching process by $CF_4$ gas. Thus, a via hole VH having the width $W_1$ is perforated in the insulating layers 2, 3 and 4, and an upper wiring groove GV having the width $W_0$ is perforated in the insulating layer 5. Then, the photoresist pattern 6 is removed.

Figure 1E:
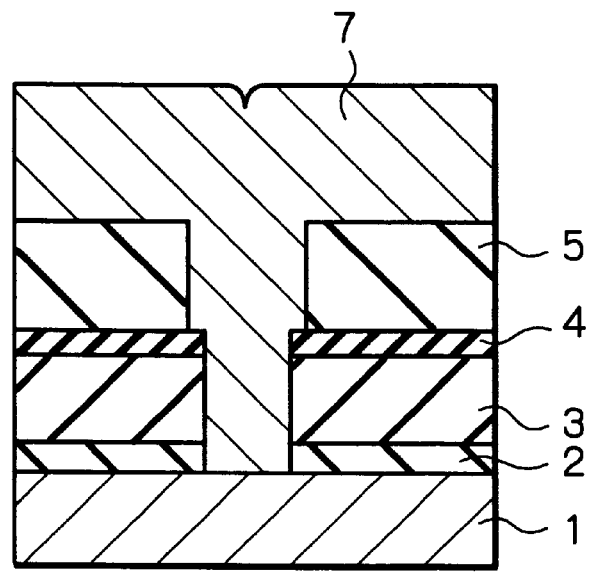

Next, referring to FIG. 1E, a conductive layer 7 made of tungsten (W) or the like is deposited on the entire surface by a CVD process.

Figure 1F:
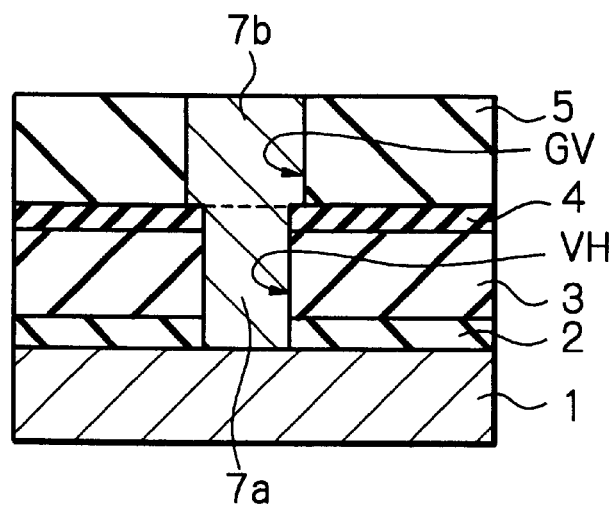

Finally, referring to FIG. 1F, the conductive layer 7 is etched back by a reactive ion etching (RIE) process, so that the conductive layer 7 is left as a via contact structure 7a and an upper wiring layer 7b within the via hole VH and the upper wiring groove GV, respectively.

Figure 2:
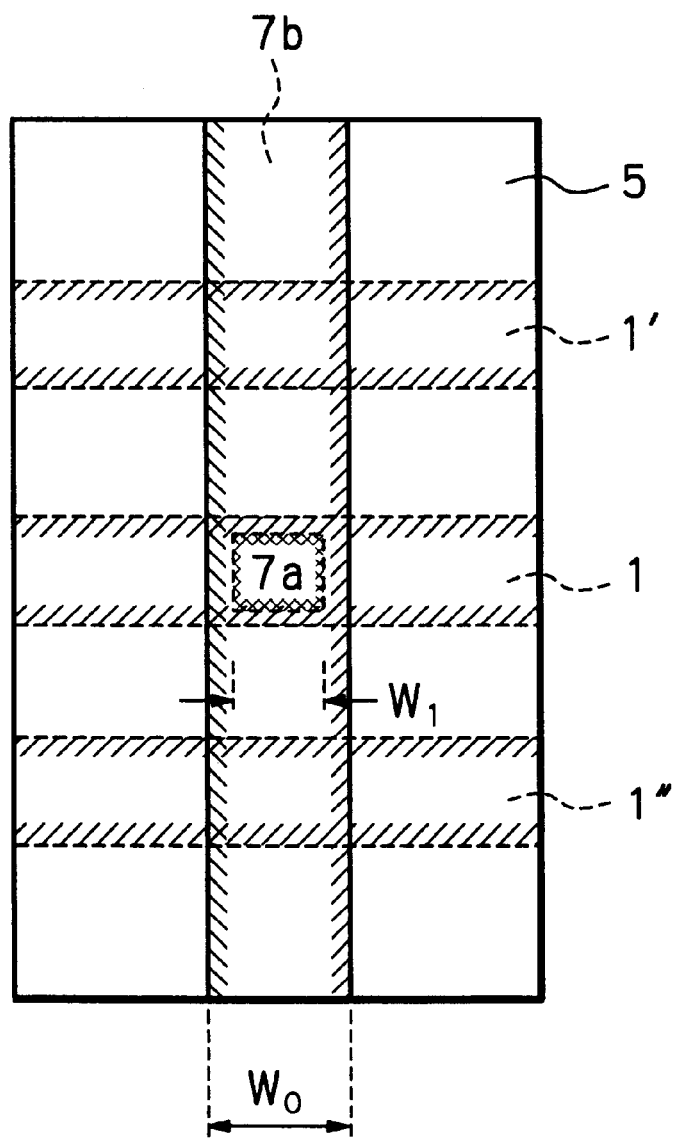
FIG. 2 is a plan view of the device of FIG. 1F.

In the prior art method as illustrated in FIGS. 1A through 1F, however, since the width $W_1$ of the via contact structure 7a is smaller than the width $W_0$ of the upper wiring layer 7b as illustrated in FIG. 2, the contact area between the via contact structure 7a and the upper wiring layer 7b is so small as to increase the resistance therebetween. As a result, the current density of a current flowing through the via contact structure 7a is increased to generate electromigration therein, which would disconnect the via contact structure 7a. Thus, the reliability is deteriorated.

In FIG. 2, note that reference numerals 1' and 1" also designate lower wiring layers adjacent to the lower wiring layer 1. In this case, since no via contact structures are formed between the lower wiring layers 1' and 1" and the upper wiring layer 7b, there are no electrical connections therebetween.

Also, in the prior art method, it is difficult to form the photoresist pattern 6 due to the recess portion 5a of the insulating layer 5. In order to avoid this difficulty, an additional flattening process such as a CMP process can be performed upon the surface of the insulating layer 5 which, however, would increase the manufacturing cost.

An embodiment of the method for manufacturing a semiconductor device including a dual-damascene structure according to the present invention will be explained next with reference to FIGS. 3A through 3F and 4.

Figure 3A:
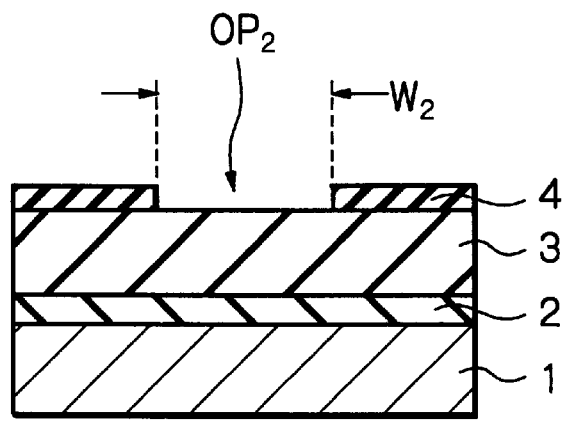
FIGS. 3A through 3F are cross-sectional views for explaining an embodiment of the method for manufacturing a semiconductor device according to the present invention.

First, referring to FIG. 3A, reference numeral 1 designates a lower wiring layer which is formed by a impurity diffusion region in a semiconductor substrate (not shown) or is formed by a conductive layer on an insulating layer (not shown) formed on the semiconductor substrate. Then, an insulating layer 2 made of SiN is deposited on the lower wiring layer 1 by a plasma CVD process. Then, an insulating layer 3 made of $SiO_2$ is deposited on the insulating layer 2 by a plasma CVD process. Then, the surface of the insulating layer 3 is flattened by a CMP process. Then, an insulating layer 4 made of SiON as an upper wiring mask is deposited on the insulating layer 3 by a plasma CVD process. Then, an opening $OP_2$ having a width $W_2$ is perforated in the insulating layer 4 by a photolithography and dry etching process by $CF_4$ gas using the insulating layer 3 as an etching stopper. Note that the opening $OP_2$ defines the size of a via contact structure.

Figure 3B:
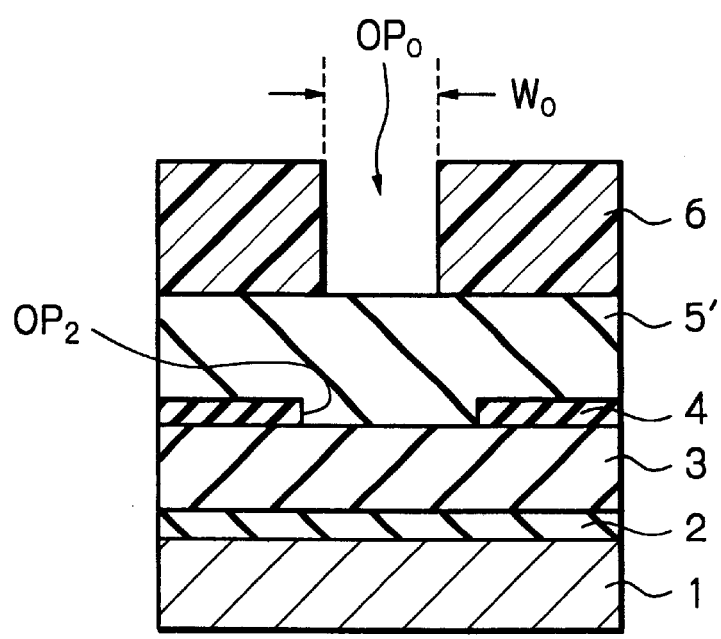

Next, referring to FIG. 3B, an insulating layer 5' made of fluid coating material is coated on the entire surface. The fluid coating material is an organic material such as hydrogen silsesquioxane (HSQ), spin on glass (SOG) or benzocyclobutene (BCB), or inorganic material such as porous silica sol. In this case, no recess portion due to the presence of the opening $OP_2$ of the insulating layer 4 is created in the insulating layer 5 because of its fluidity. Then, a photoresist pattern 6 where an opening $OP_0$ having a width $W_0$ ($<W_2$) is formed on the insulating layer 5. Note that the opening $OP_0$ defines the size of an upper wiring layer.

Figure 3C:
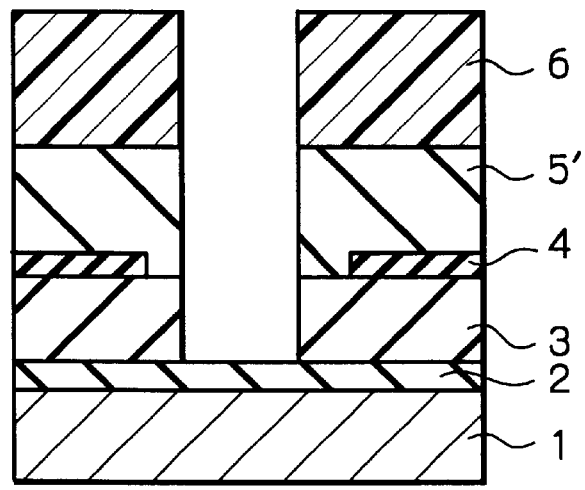

Next, referring to FIG. 3C, the insulating layers 5' and 3 are etched by a dry etching process by $CHF_3$ gas or a mixture gas of $CF_4$ and $H_2$ using the photoresist pattern 6 as a mask and the insulating layers 4 and 2 as etching stoppers.

Figure 3D:
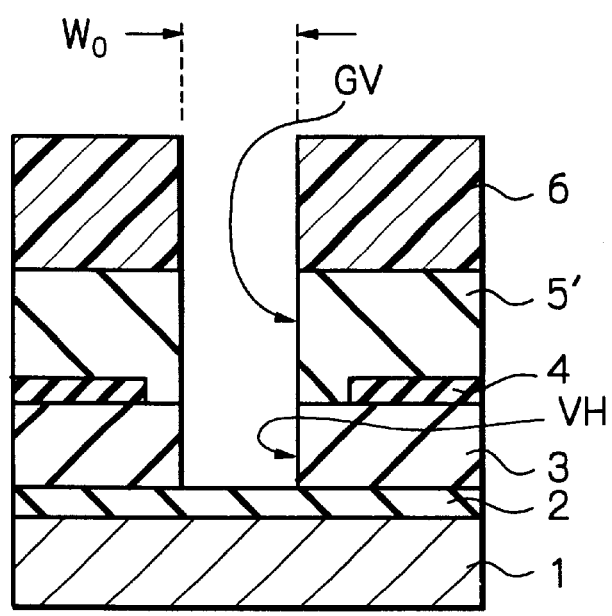

Next, referring to FIG. 3D, an exposed portion of the insulating layer 2 is etched by a dry etching process by $CF_4$ gas. Thus, a via hole VH having the width $W_0$ is perforated in the insulating layers 2, 3 and 4, and an upper wiring groove GV having the width $W_0$ is perforated in the insulating layer 5. Then, the photoresist pattern 6 is removed.

Figure 3E:
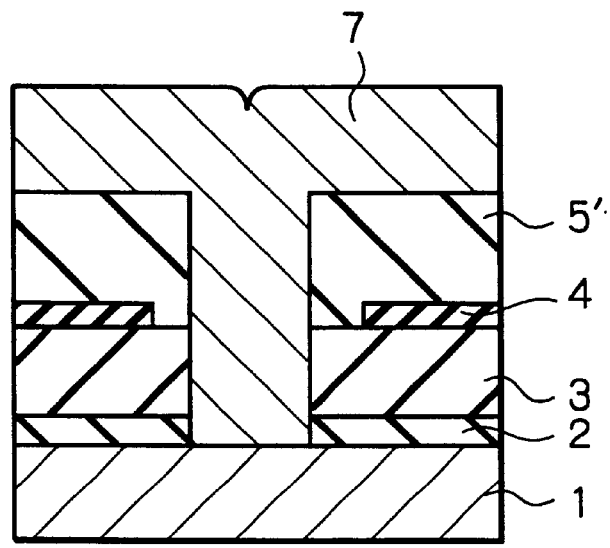

Next, referring to FIG. 3E, a conductive layer 7 made of W or the like is deposited on the entire surface by a CVD process.

Figure 3F:
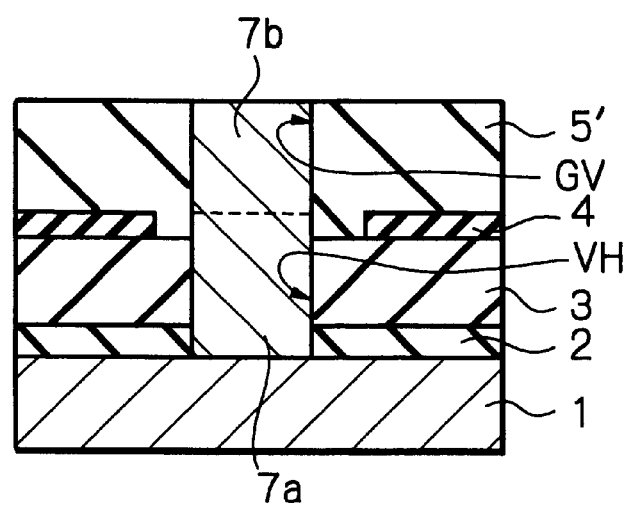

Finally, referring to FIG. 3F, the conductive layer 7 is etched back by an RIE process, so that the conductive layer 7 is left as a via contact structure 7a and an upper wiring layer 7b within the via hole VH and the upper wiring groove GV, respectively.

Figure 4:
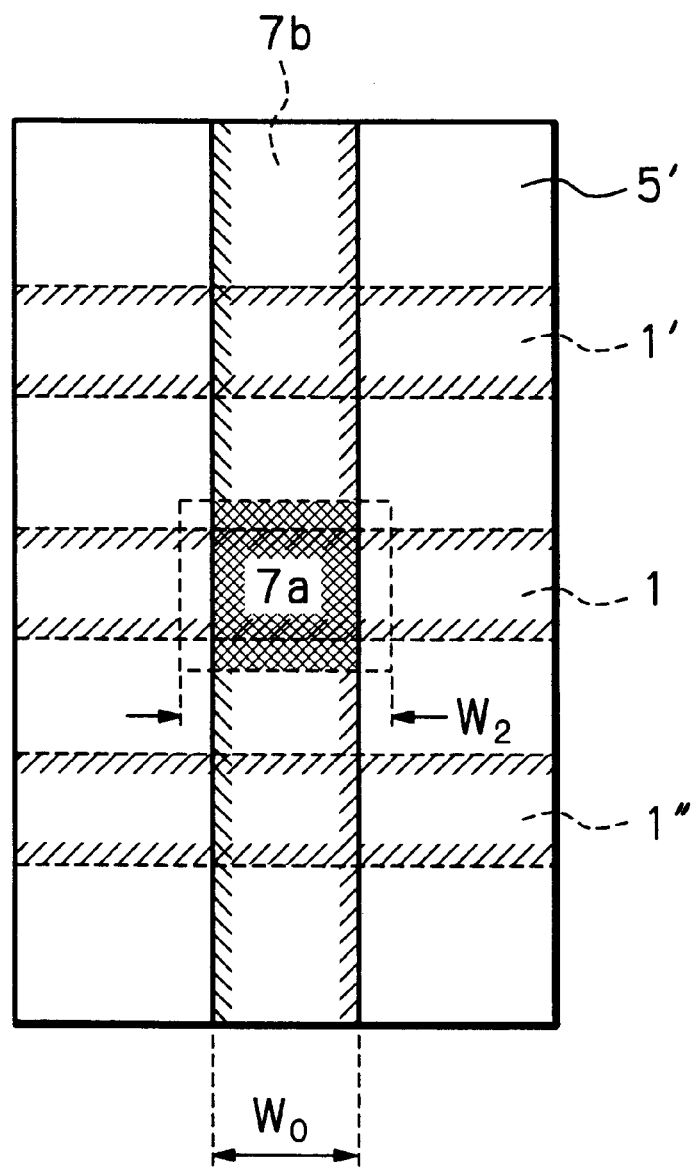
FIG. 4 is a plan view of the device of FIG. 3F.

In the embodiment as illustrated in FIGS. 3A through 3F, since the width $W_0$ of the via contact structure 7a is the same as the width $W_0$ of the upper wiring layer 7b as illustrated in FIG. 4, the contact area between the via contact structure 7a and the upper wiring layer 7b can be large to decrease the resistance therebetween. As a result, the current density of a current flowing through the via contact structure 7a is decreased to generate no electromigration therein, which would avoid the disconnection of the via contact structure 7a. Thus, the reliability is improved.

Also, in FIG. 4, note that reference numerals 1' and 1" also designate lower wiring layers adjacent to the lower wiring layer 1. In this case, since no via contact structures are formed between the lower wiring layers 1' and 1" and the upper wiring layer 7b, there are no electrical connections therebetween.

Also, in the above-described embodiment, it is easy to form the photoresist pattern 6 due to no recess portion of the insulating layer 5' without carrying out a CMP process upon the insulating layer 5'.

In the above-described embodiment as well as in the prior art, since the insulating layer 4 is made of SiON having a smaller dielectric constant than that of $SiO_2$, the parasitic capacitance between the lower wiring layer 1 and the upper wiring layer 7b can be decreased, which suppresses the delay of signals propagating on the wiring layers 1 and 7b. In addition, in the above-described embodiment, since the insulating layer 5' is made of HSQ, SOG, BCB or porous silica sol having a smaller dielectric constant than that of $SiO_2$, the above-mentioned parasitic capacitance can be further decreased, which further suppresses the delay of signals.

In the above-described embodiment, note that the insulating layer 3 can be made of the fluid coating material as the insulating layer 5', in order to thereby further suppress the delay of signals.

As explained hereinabove, according to the present invention, since the contact area between a via contact structure and an upper wiring layer can be large, the resistance therebetween can be decreased, thus improving the reliability.

Also, since an insulating layer above an upper wiring mask layer is made of fluid coating material, there is no recess portion on this insulating layer without performing a CMP process thereupon, so that it is easy to form a photoresist pattern on this insulating layer.

What is claimed is:

1. A semiconductor device comprising:

a lower wiring layer;

a first insulating layer formed on said lower wiring layer, said first insulating layer having a via hole with a width;

a via mask layer formed on said first insulating layer, said via mask layer having an opening with a width larger than the width of said via hole, said opening opposing said via hole;

a second insulating layer formed on said via mask layer, said second insulating layer having an upper wiring groove whose width coincides with the width of said via hole;

a via contact structure buried in said via hole; and an upper wiring layer buried in said upper wiring groove, wherein said second insulating layer is formed of a material having a smaller dielectric constant than that of silicon dioxide.

2. The device as set forth in claim 1, wherein said second insulating layer is made of fluid coating material.

3. The device as set forth in claim 2, wherein said fluid coating material is one of hydrogen silsesquioxane, spin on glass and benzocyclobutene.

4. The device as set forth in claim 1, wherein said second insulating layer is made of porous silica sol.

5. The device as set forth in claim 1, wherein said first insulating layer comprises:

a silicon nitride layer; and a silicon oxide layer formed on said silicon nitride layer.

6. The device as set forth in claim 1, wherein said first insulating layer comprises:

a silicon nitride layer; and a fluid coating layer formed on said silicon nitride layer.

7. The device as set forth in claim 6, wherein said fluid coating layer is made of one of hydrogen silsesquioxane, spin on glass and benzocyclobutene.

8. The device as set forth in claim 6, wherein said fluid coating layer is made of porous silica sol.

9. The device as set forth in claim 1, wherein said via mask layer is made of SiON.

10. The device as set forth in claim 1, wherein said lower wiring layer comprises an impurity region in a semiconductor substrate.

11. The device as set forth in claim 1, wherein said lower wiring layer comprises a conductive layer formed above a semiconductor substrate.

12. A semiconductor device comprising:

a lower wiring layer;

an etching stopper layer formed on said lower wiring layer;

a first insulating layer formed on said etching stopper layer, said first insulating layer, said etching stopper layer and said first insulating layer having a via hole;

a via mask layer formed on said first insulating layer, said via mask layer having an opening opposing said via hole;

a second insulating layer formed on said via mask layer, said second insulating layer having a smaller dielectric constant than that of silicon dioxide, said second insulating layer having an upper wiring groove opposing said via hole;

a via contact structure buried in said via hole; and an upper wiring layer buried in said tipper wiring groove.

13. The device as set forth in claim 12, wherein said second insulating layer is made of fluid coating material.

14. The device as set forth in claim 13, wherein said fluid coating material is one of hydrogen silsesquioxane, spin on glass and benzocyclobutene.

15. The device as set forth in claim 12, wherein said second insulating layer is made of porous silica sol.

16. The device as set forth in claim 12, wherein said first insulating layer comprises:

a silicon nitride layer; and a silicon oxide layer formed on said silicon nitride layer.

17. The device as set forth in claim 12, wherein said first insulating layer comprises:

a silicon nitride layer; and a fluid coating layer formed on said silicon nitride layer.

18. The device as set forth in claim 17, wherein said fluid coating layer is made of one of hydrogen silsesquioxane, spin on glass and benzocyclobutene.

19. The device as set forth in claim 17, wherein said fluid coating layer is made of porous silica sol.

20. The device as set forth in claim 12, wherein said via mask layer is made of SiON.

21. The device as set forth in claim 12, wherein said lower wiring layer comprises an impurity region in a semiconductor substrate.

22. The device as set forth in claim 12, wherein said lower wiring layer comprises a conductive layer formed above a semiconductor substrate.

23. A semiconductor device comprising:

a lower wiring layer;

an etching stopper layer formed on said lower wiring layer;

a first insulating layer formed on said etching stopper layer, said etching stopper layer and said first insulating layer having a via hole:

a via mask layer formed on said first insulating layer, said via mask layer having an opening opposing said via hole;

a second insulating layer formed on said via mask layer, said second insulating layer comprising a fluid coating material, said second insulating layer having an upper wiring groove opposing sald via hole;

a via contact structure buried in said via hole; and an upper wiring layer buried in said upper wiring groove.

24. The device as set forth in claim 23, wherein said fluid coating material is one of hydrogen silsesquioxane, spin on glass and benzocyclobutene.

25. The device as set forth in claim 23, wherein said second insulating layer is made of porous silica sol.

26. The device as set forth in claim 23, wherein said first insulating layer comprises:

a silicon nitride layer; and a silicon oxide layer formed on said silicon nitride layer.

27. The device as set forth in claim 23, wherein said first insulating layer comprises:

a silicon nitride layer; and a fluid coating layer formed on said silicon nitride layer.

28. The device as set forth in claim 27, wherein said fluid coating layer is made of one of hydrogen silsesquioxane, spin on glass and benzocyclobutene.

29. The device as set forth in claim 27, wherein said fluid coating layer is made of porous silica sol.

30. The device as set forth in claim 23, wherein said via mask layer is made of SiON.

31. The device as set forth in claim 23, wherein said lower wiring layer comprises an impurity region in a semiconductor substrate.

32. The device as set forth in claim 23, wherein said lower wiring layer comprises a conductive layer formed above a semiconductor substrate.

* * * * *